United States Patent
Kim et al.

(12) 
(10) Patent No.: US 6,255,586 B1
(45) Date of Patent: Jul. 3, 2001

(54) INTERLOCKED BONDING PAD STRUCTURES AND METHODS OF FABRICATION THEREFOR

(75) Inventors: Hark-moo Kim; Jin-kook Jeong, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/384,748

(22) Filed: Aug. 27, 1999

(30) Foreign Application Priority Data

Sep. 4, 1998 (KR) .................................. 98-36474

(51) Int. Cl.⁷ ...................................... H02G 3/08
(52) U.S. Cl. ........................... 174/52.1; 361/813
(58) Field of Search ................. 174/52.1, 52.4; 361/807, 813, 808; 257/666, 676

(56) References Cited

U.S. PATENT DOCUMENTS 5,059,756 * 10/1991 Henschenp et al. .............. 219/85.22
5,360,941 * 11/1994 Roes ..................... 174/35 R
5,365,409 * 11/1994 Kwon et al. .......................... 361/813

* cited by examiner

Primary Examiner—Adolf Deneke Berhane
(74) Attorney, Agent, or Firm—Myers Bigel Sibley & Sajovec

(57) ABSTRACT

A bonding pad structure includes a first conductive layer. A first insulation layer is disposed on the first conductive layer. A conductive region is disposed on the first insulation layer, the conductive region including a conductive pad region and a plurality of conductive fingers extending from the conductive pad region through respective openings in the first insulation layer and the first conductive layer, contacting the first conductive layer along respective sidewall surfaces of the respective openings in the first conductive layer. A plurality of conductive vias may extend between the first conductive layer and the conductive pad region, interspersed amongst the plurality of conductive fingers. According to another aspect, a bonding pad includes a conductive finger extending through an opening in an insulation layer to contact the underlying conductive layer, the conductive finger having a flared portion that increases in cross-sectional area in a direction towards the substrate and that mates with a flared sidewall surface of the opening in the insulation layer. According to one embodiment, the conductive finger has a convex sidewall surface that mates with a concave sidewall surface of the opening in the insulation layer. According to another embodiment, the conductive finger has a slanted inclined sidewall surface that mates with a slanted sidewall surface of the opening in the insulation layer. Related fabrication methods are also described.

35 Claims, 5 Drawing Sheets

INTERLOCKED BONDING PAD STRUCTURES AND METHODS OF FABRICATION THEREFOR

FIELD OF THE INVENTION

The present invention relates to microelectronic devices and methods of fabrication therefore, and more particularly, to bonding pad structures for microelectronic devices and methods of fabrication therefore.

BACKGROUND OF THE INVENTION

Bonding pads (often referred to as "bondpads") in microelectronic devices such as integrated circuits are commonly used during electric die sort (EDS) tests and other testing and fabrication processes. A typical bonding pad includes a plurality of metal wiring layers, connected to each other by a contact plug. The bonding pad typically has relatively low conductivity because the contact plug that connects the metal wiring layers is typically made of tungsten.

When a probe tip is connected to a bonding pad during a process such as EDS, physical force may be applied to the bonding pad to the point that damage to the bonding pad structure may occur. Similarly, wire bonding processes may apply sufficient force to the bonding pad such that the structure of the bonding pad is damaged. For example, a phenomenon called chip out under bondpad (COUB) may occur, wherein a lower portion of the bonding pad is broken. The occurrence of COUB can be determined by performing a bond pull test (BPT), wherein a wire bonded to the bonding pad is pulled upward by a predetermined force that is small enough such that an undamaged bonding pad will not pull free, but large enough such that a damaged bond pad will break free at its lower portions.

A device having a COUB defect can have several problems. First, a wire connected to a bonding pad suffering from COUB may be easily detached. Second, current may leak at the area where COUB occurs, potentially deteriorating electrical characteristics of the device. Third, the overall durability of the device may be reduced, which in turn may reduce the reliability of electronic equipment in which the device is used.

SUMMARY OF THE INVENTION

In light of the foregoing, it is an object of the present invention to provide bonding pads and methods of fabrication therefore which are less vulnerable to COUB.

It is another object of the present invention to provide bonding pads and methods of fabrication therefore that can be used for connection to multiple conductive layers.

These and other objects, features and advantages may be provided according to the present invention by bonding pads which include one or more conductive fingers that extend from a pad region through one or more insulation layers to contact one or more conductive layers on a substrate. According to one aspect of the present invention, a plurality of conductive fingers extend through the insulation layer from a pad region, and are interspersed among a plurality of conductive vias extending between the pad region and the conductive layer. According to another aspect of the present invention, a bonding pad finger includes a flared portion that increases in cross-sectional area in a direction towards the substrate, interlocking the finger with the layer structure. In one embodiment of the invention, the fingers have a convex sidewall surface that mates with a complementary concave surface of an opening in an insulation layer through which the conductive finger extends. In yet another embodiment of the present invention, a bonding pad finger has a slanted surface that mates with a complementary slanted surface in an opening in a layer through which the conductive finger extends. The use of an interlocking structure can provide increased structural strength and render the bonding pad less vulnerable to detachment from underlying structures.

According to one embodiment of the present invention, a bonding pad structure includes a first conductive layer. A first insulation layer is disposed on the first conductive layer. A conductive region is disposed on the first insulation layer, the conductive region including a conductive pad region and a plurality of conductive fingers extending from the conductive pad region through respective openings in the first insulation layer and the first conductive layer. The conductive fingers contact the first conductive layer along respective sidewall surfaces of the respective openings in the first conductive layer. A plurality of conductive vias may extend between the first conductive layer and the conductive pad region, interspersed amongst the plurality of conductive fingers.

A second insulation layer may underlie the first conductive layer, disposed on a second conductive layer that underlies the second insulation layer. Respective ones of the plurality of conductive fingers may extend through respective openings in the first insulation layer, the first conductive layer and the second insulation layer to contact the second conductive layer. A plurality of conductive vias may extend between the first conductive layer and the second conductive layer, interspersed among the plurality of conductive fingers.

According to another embodiment of the present invention, the conductive region includes a third conductive layer on the first insulation layer, substantially conforming to sidewall surfaces of the openings in the first and second insulation layers, defining a plurality of volumes extending through the first insulation layer, the first conductive layer, and the second insulation layer, and contacting the second conductive layer through the openings in the first and second insulation layers. Respective ones of a plurality of conductive regions fill respective ones of the volumes. A fourth conductive layer is disposed on the third conductive layer, contacting the plurality of conductive regions.

According to another aspect of the present invention, a microelectronic device includes a substrate and a conductive layer on the substrate. An insulation layer is disposed on the conductive layer, the insulation layer having a first side, an opposite second side contacting the conductive layer, and an opening passing from the first side to the second side including a flared portion that increases in cross-sectional area in a direction away from the first side. A conductive finger is interlocked with the insulation layer, the conductive finger extending from the first side of the insulation layer to the conductive layer and substantially conforming to the flared portion of the opening. In one embodiment of the present invention, the opening in the insulation layer has a concave sidewall surface, and the interlocked conductive finger has a complementary convex sidewall surface contacting the concave sidewall surface of the opening. In another embodiment of the present invention, the opening in the insulation layer has a slanted sidewall surface. The conductive finger has a complementary slanted sidewall surface mating with the slanted sidewall surface of the opening in the insulation layer.

According to another aspect of the present invention, a bonding pad for contacting a conductive layer underlying an insulation layer on a microelectronic substrate includes a conductive finger extending through an opening in the insulation layer to contact the underlying conductive layer, the conductive finger having a flared portion that increases in cross-sectional area in a direction towards the substrate and that mates with a flared sidewall surface of the opening in the insulation layer. The bonding pad may further include a conductive pad portion on the insulation layer, wherein the conductive finger extends from the conductive pad portion through the insulation layer to conduct the underlying conductive layer. According to one embodiment of the present invention, the conductive finger has a convex sidewall surface that mates with a concave sidewall surface of the opening in the insulation layer. According to another embodiment of the present invention, the conductive finger has a slanted sidewall surface that mates with a slanted sidewall surface of the opening in the insulation layer.

According to method aspects of the present invention, a bonding pad structure is formed by forming a first conductive layer on a substrate and forming a first insulation layer on the first conductive layer. A conductive region is then formed on the first insulation layer, the conductive region including a conductive pad region and a plurality of conductive fingers extending from the conductive pad region through respective openings in the first insulation layer and the first conductive layer, contacting the first conductive layer along respective sidewall surfaces of the openings in the first conductive layer.

According to one embodiment of the present invention, the conductive region is formed by removing portions of the first insulation layer to form a plurality of cavities and expose portions of the first conductive layer in the cavities. Conductive material is then deposited on the substrate, covering remaining portions of the first insulation layer, filling the cavities, and contacting the exposed portions of the first conductive layer. Concave sidewall surfaces may be formed in openings in the first insulation layer, and the deposited conductive material may form a plurality of conductive fingers having convex surfaces that contact the concave surfaces in the openings in the first insulation layer. Alternatively, slanted sidewall surfaces may be formed in the cavities, and the deposited conductive material may form conductive fingers having slanted surfaces that contact the slanted surfaces in the cavities.

According to another embodiment of the present invention, a second conductive layer is formed that substantially conforms to the first insulation layer and to sidewall surfaces of the cavities, defining a new plurality of cavities and contacting the exposed portions of first conductive layer. A plurality of conductive regions are formed in the new plurality of cavities. A third conductive layer is then formed on the second conductive layer and the plurality of conductive regions.

According to other method aspects, a bonding pad for contacting a conductive layer underlying an insulation layer on a microelectronic substrate is formed by forming an opening in the insulation layer, the opening including a flared portion that increases in cross-sectional area towards the substrate. A conductive region is formed, interlocked with the insulation layer. The conductive region includes a conductive finger extending through the opening in the insulation layer to contact the underlying conductive layer, the conductive finger having a flared portion that increases in cross-sectional area towards the substrate and mates with the flared portion of the opening in the insulation layer. The opening in the insulation layer may be formed such that it has a concave sidewall surface, and the conductive region may be formed such that the conductive finger has a convex surface that contacts the concave surface of the opening. Alternatively, the opening in the insulation layer may be formed such that is has a slanted sidewall surface, and the conductive region may be formed such that the conductive finger has a slanted sidewall surface that contacts the slanted sidewall surface of the opening.

DETAILED DESCRIPTION OF PREFERRED EMBODIMENTS

Figure 1:
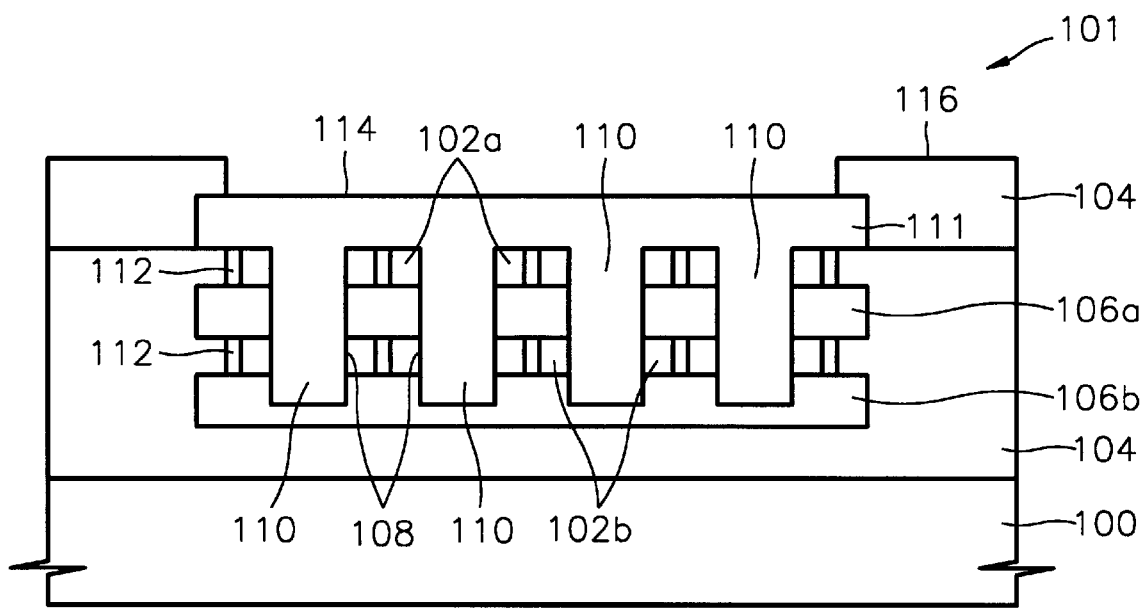
FIG. 1 is a cross-sectional view of a bonding pad structure according to one embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2:
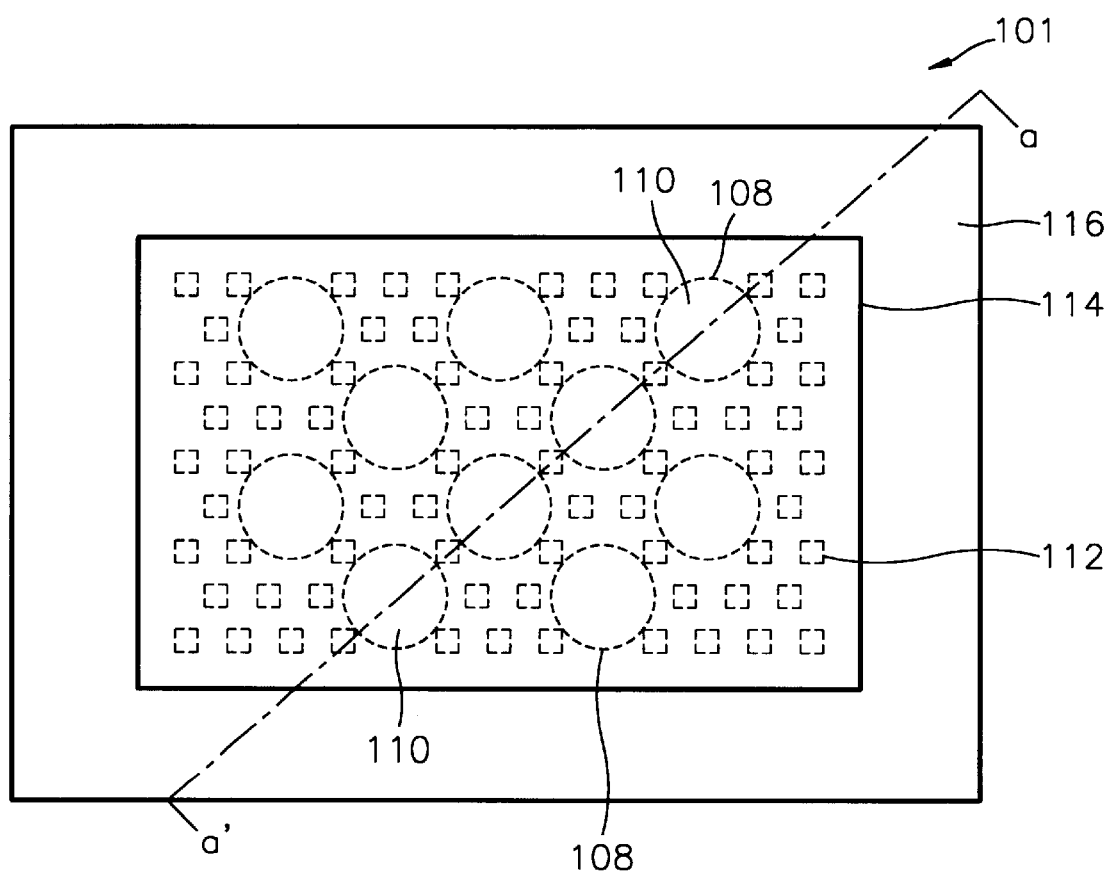
FIG. 2 is a plan view of the bonding pad structure of FIG. 1.

FIG. 2 is a plan view of a bonding pad structure 101 for a microelectronic device according to an embodiment of the present invention, and FIG. 1 is a cross-sectional view of the bonding pad structure 101 of FIG. 1 along a line a–a'. Referring to FIGS. 1 and 2, a bonding pad 114 includes a conductive pad region 111. A plurality of conductive fingers 110 extend from the conductive pad region 111 into cavities 108, passing through openings in a first insulation layer 102a, a first conductive layer 106a, and a second insulation layer 102b and penetrating into a second conductive layer 106b. The conductive fingers 110 contact the first conductive layer 106 at sidewall surfaces of the fingers 110. The second conductive layer 106b is disposed on an insulation layer 104 formed on a substrate 100, and a passivation layer 116 covers edge portions of the conductive pad region 111.

First and second pluralities of conductive vias 112 connect the first conductive layer 106a to the second conductive layer 106b, and the first conductive layer 106a to the conductive pad region 111, respectively. Preferably, the vias 112 comprise the same material as the first and second conductive layers 106a, 106b, e.g., a metal such as aluminum or copper, and the fingers preferably include tungsten. Accordingly, the bonding pad structure illustrated in FIG. 1 may provide improved conductivity in comparison to conventional bonding pad structures. In addition, the bonding pad 114 has an impact-absorbing structure that can reduce the likelihood of COUB.

Figure 3:
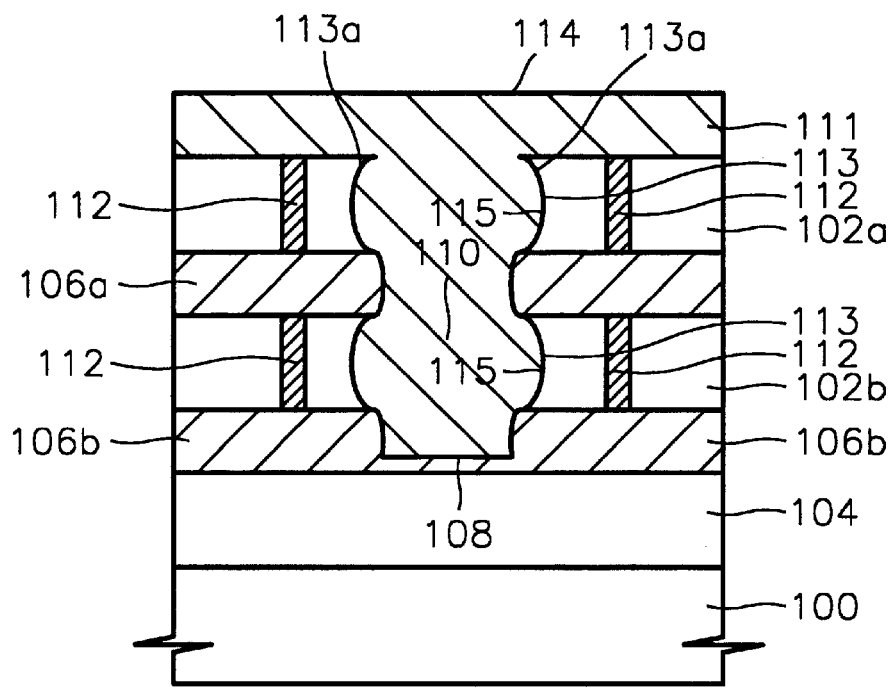
FIG. 3 is a cross-sectional view of a scalloped sidewall cavity for a bonding pad finger according to another embodiment of the present invention.

FIG. 3 is a cross-sectional view illustrating a cavity 108 for forming a conductive finger such as the fingers 110 of FIG. 1 according to an embodiment of the present invention. The second conductive layer 106b, second insulation layer 102b, first conductive layer 106a and first insulation layer 102a are formed on the insulation layer 104 disposed on the substrate 100, for example, by sequential deposition processes. Before formation of the first conductive layer 106a, a plurality of conductive vias 112 is formed, each of which extend through the second insulation layer 102b and which are contacted by the first conductive layer 106a when it is formed. Similarly, after formation of the first insulation layer 102a, a plurality of conductive vias 112 is formed, each of which extends through the first insulation layer 102a to contact the first conductive layer 106a.

The cavity 108 is formed by removing portions of the first insulation layer 102a, the first conductive layer 106a, the second insulation layer 102b and the second conductive layer 106b, for example, by dry etching. Concave (scalloped) sidewall surfaces 113 may then be formed in the first insulation layer 102a and/or the second insulation layer 102b using a process such as wet etching, such that flared portions 113a of the openings in the first and second insulation layers 102a, 102b increase in diameter in a direction towards the substrate 100. Thus, when conductive material is deposited in the cavity 108, e.g., by sputtering or other deposition process, the conductive finger 110 formed in the cavity 108 has convex sidewall surfaces 115 that substantially conform to (mate with) the complementary concave surfaces 113. The finger 110 is thus interlocked with the underlying insulation layer(s), providing increased strength. For example, the structure of FIG. 3 can provide increased resistance to lifting forces on a wire bonded to the bonding pad 114 produced by contraction and expansion of packaging in which the structure is mounted.

Figure 4:
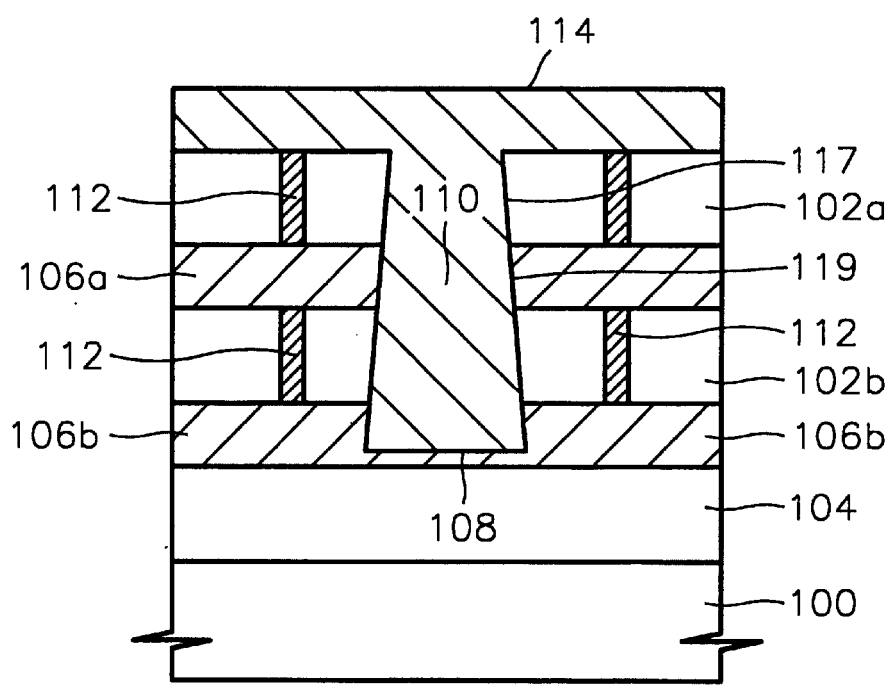
FIG. 4 is a cross-sectional view of a slanted sidewall cavity for a bonding pad finger according to another embodiment of the present invention.

FIG. 4 is a cross-sectional view illustrating a cavity 108 for forming a conductive finger such as the fingers 110 of FIG. 1 according to another embodiment of the present invention. The second conductive layer 106b, second insulation layer 102b, first conductive layer 106a, first insulation layer 102a and conductive vias 112 may be formed as described above with reference to FIG. 3. The cavity 108 is formed by removing portions of the first insulation layer 102a, the first conductive layer 106a, the second insulation layer 102b and the second conductive layer 106b, for example, by controlled dry etching. The portions of the layers are removed such that the openings in the layers 102a, 106a, 102b, 106b increase in cross-sectional area in a direction towards the substrate, away from the upper surface of the first insulation layer 102b, forming slanted (flared) sidewall surfaces 117 in the cavity 108. Thus, when conductive material is deposited in the cavity 108, e.g., by sputtering or other deposition process, the conductive finger 110 formed in the cavity 108 has slanted (flared) sidewall surfaces 119 that substantially conform to the complementary slanted surfaces 117. The finger is 110 is thus interlocked with the underlying layer(s), providing increased strength in a manner similar to the embodiment of FIG. 3.

Figure 5:
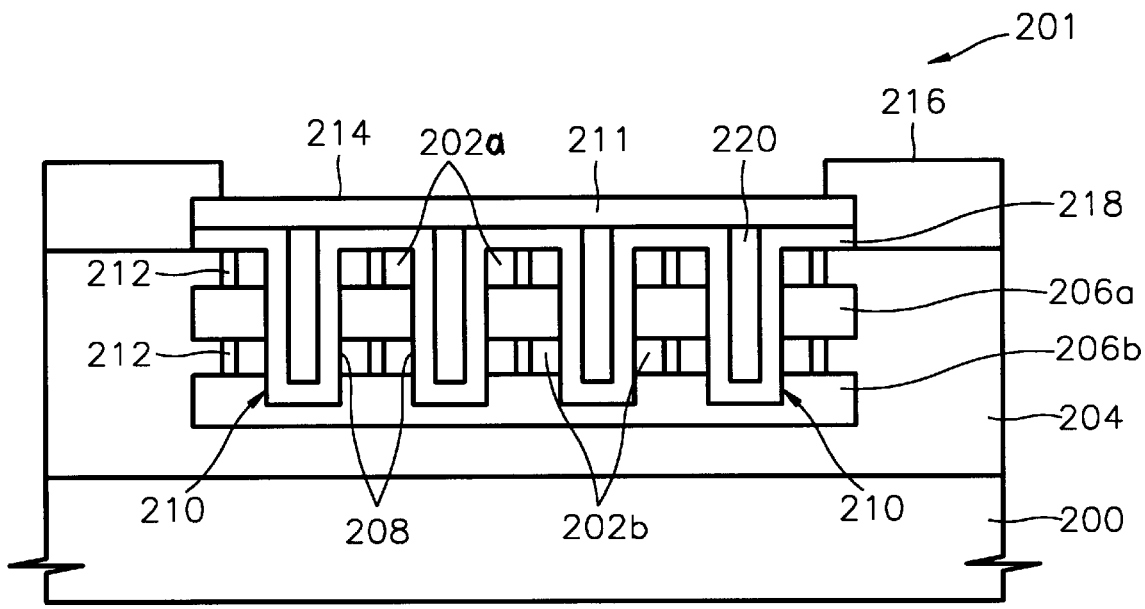
FIG. 5 is a cross-sectional view of a bonding pad structure according to another embodiment of the present invention.
Figure 6:
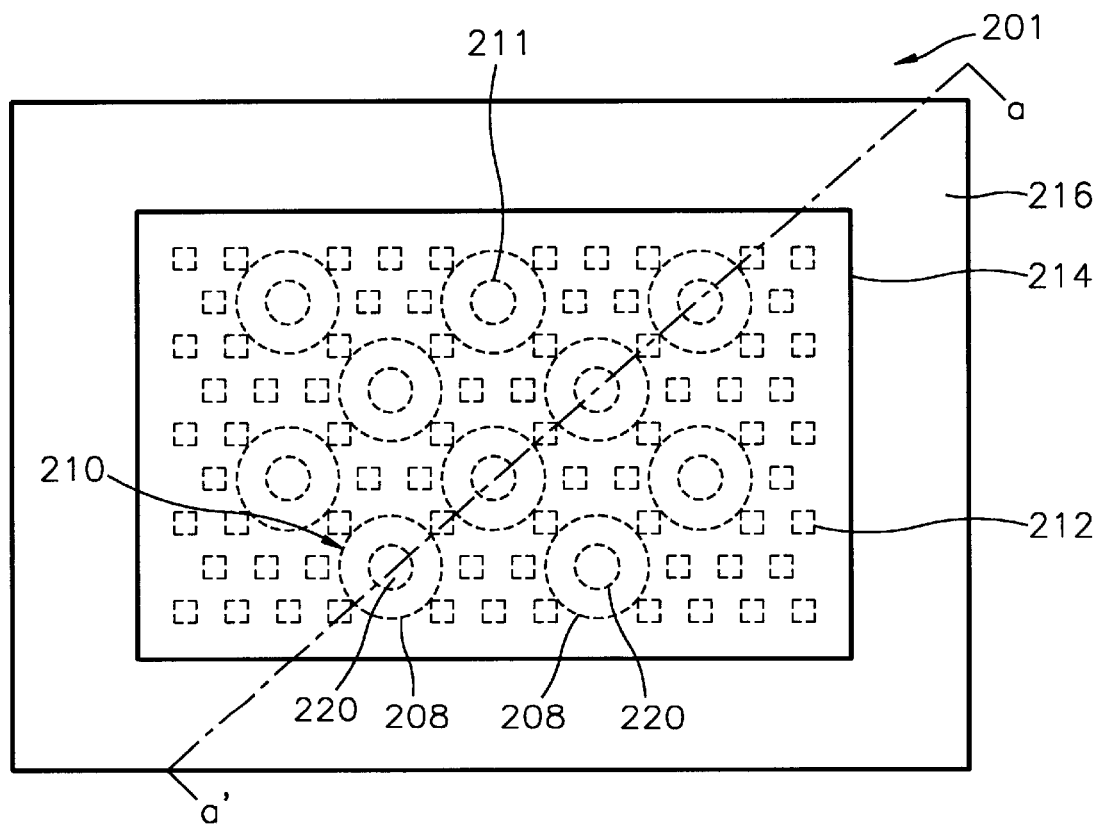
FIG. 6 is a plan view of the bonding pad structure of FIG. 5.

FIG. 6 is a plan view of a bonding pad structure 201 for a microelectronic device according to another embodiment of the present invention, and FIG. 5 is a cross-sectional view of the bonding pad structure 201 of FIG. 6 along a line a–a'. Referring to FIGS. 5 and 6, a bonding pad 214 includes a conductive pad region 211, e.g., a layer of layer of aluminum or copper. A plurality of conductive fingers 210 extend from the conductive pad region 211 into cavities 208, passing through openings in a first insulation layer 202a, a first conductive layer 206a, and a second insulation layer 202b and penetrating into a second conductive layer 206b. According to the illustrated embodiment, the conductive fingers 210 have a composite structure comprising a conductive region 220, preferably tungsten, sheathed in a conductive layer 218, such as an aluminum-or copper-containing layer. The conductive fingers 210 contact the first conductive layer 206a at sidewall surfaces of the fingers 210. The second conductive layer 206b is disposed on an insulation layer 204 formed on a substrate 200, and a passivation layer 216 covers edge portions of the conductive pad region 211. First and second pluralities of conductive vias 212 connect the first conductive layer 206a to the second conductive layer 206b, and the first conductive layer 206a to the conductive layer 218, respectively. Preferably, the vias 212 comprise the same material as the first and second conductive layers 206a, 206b, e.g., aluminum or copper.

Figure 7:
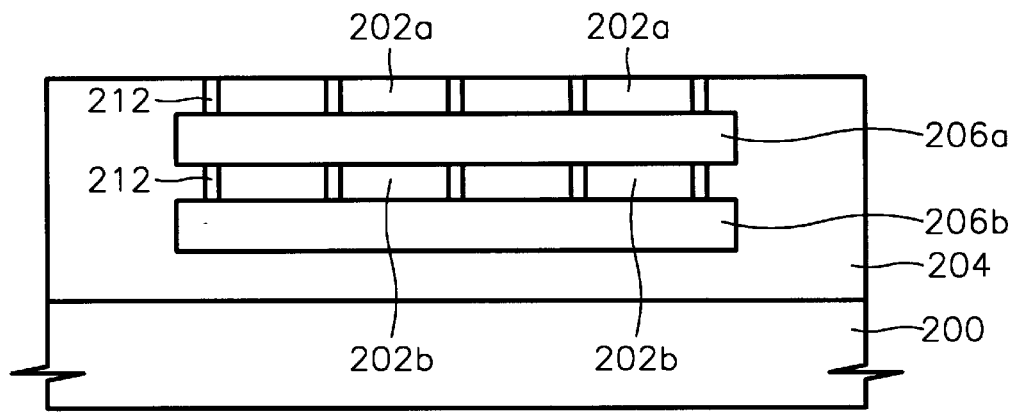
FIGS. 7–11 are cross-sectional views of intermediate fabrication products illustrating exemplary operations for fabricating a bonding pad structure according to aspect of the present invention.

FIGS. 7–11 are cross-sectional views of intermediate fabrication products illustrating exemplary operations for fabricating the structure 201 of FIGS. 5 and 6. Referring to FIG. 7, a lower structure such as a transistor (not shown) is formed on a semiconductor substrate 200, and an insulation layer 204 is formed on the resultant structure. The second conductive layer 206b and the second insulation layer 202b are sequentially formed on the insulation layer 204, for example, by sequential deposition. Conductive vias 212 are formed through the second insulation layer 202b, contacting the second conductive layer 206b. A process such as chemical mechanical polishing (CMP) may be performed to flatten the surface of the resultant structure. The first conductive layer 206a and the first insulation layer 202a are then formed, e.g., by sequential deposition. Conductive vias 212 are formed through the first insulation layer 202a as well, contacting the first conductive layer 206a.

Figure 8:
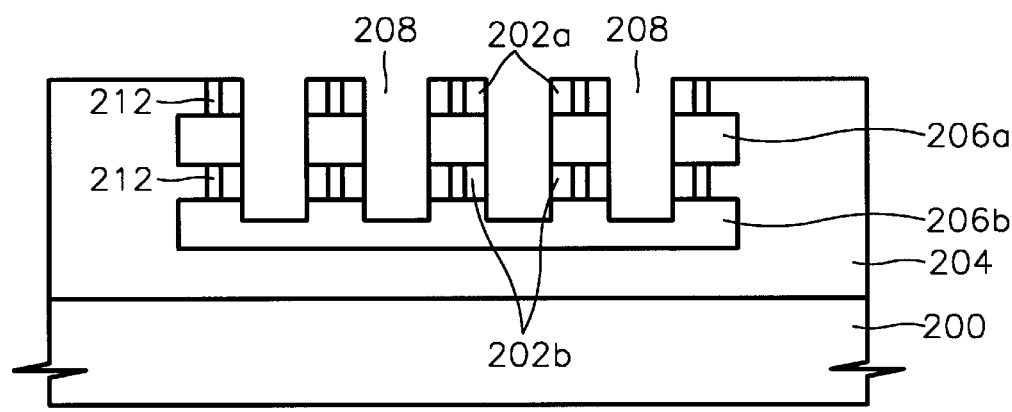

Referring to FIG. 8, the cavities 208 are then formed, for example, by etching through the first insulation layer 202a, the first conductive layer 206a, and the second insulation layer 202b, and into the second conductive layer 206b using photomasking techniques well known to those skilled in the art. The cavities 208 may be formed with scalloped or slanted sidewall surfaces (not shown) as described with reference to FIGS. 3 and 4.

Figure 9:
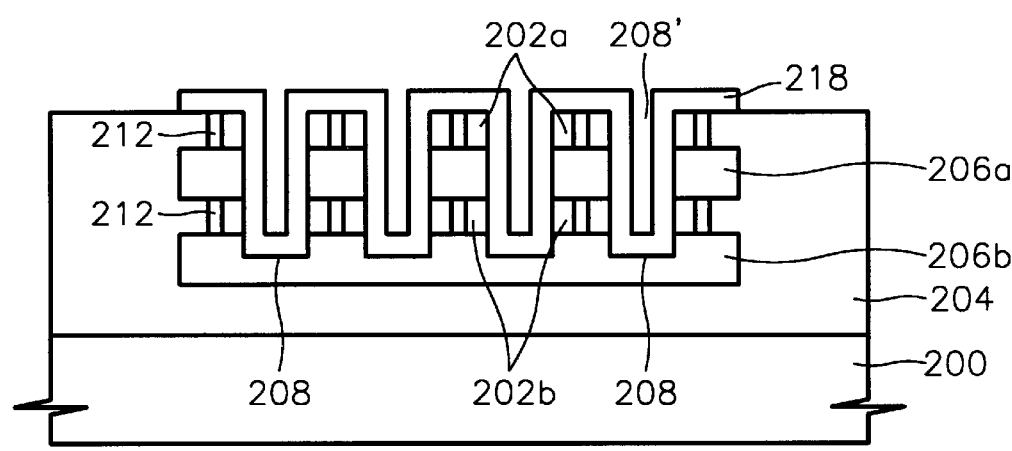

As illustrated in FIG. 9, a conductive layer 218 is then deposited, substantially conforming to a portion of the upper surface of the first insulation layer 202a and sidewall surfaces of the cavities 208, contacting exposed portions of the second conductive layer 206b and forming new cavities 208' within the cavities 208. The conductive layer 218 preferably comprises a metal such as aluminum or copper deposited by sputtering or chemical vapor deposition (CVD).

Figure 10:
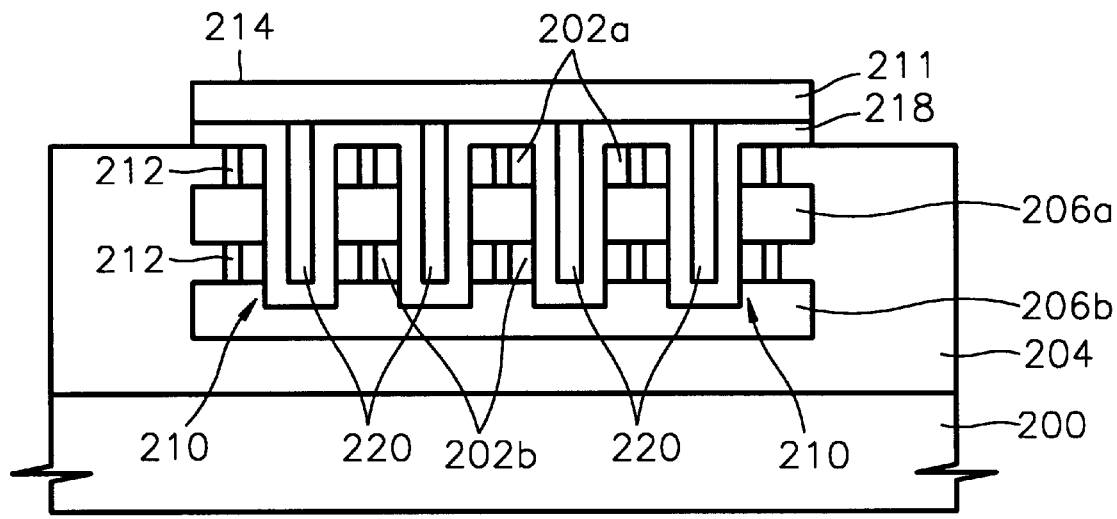
Figure 11:
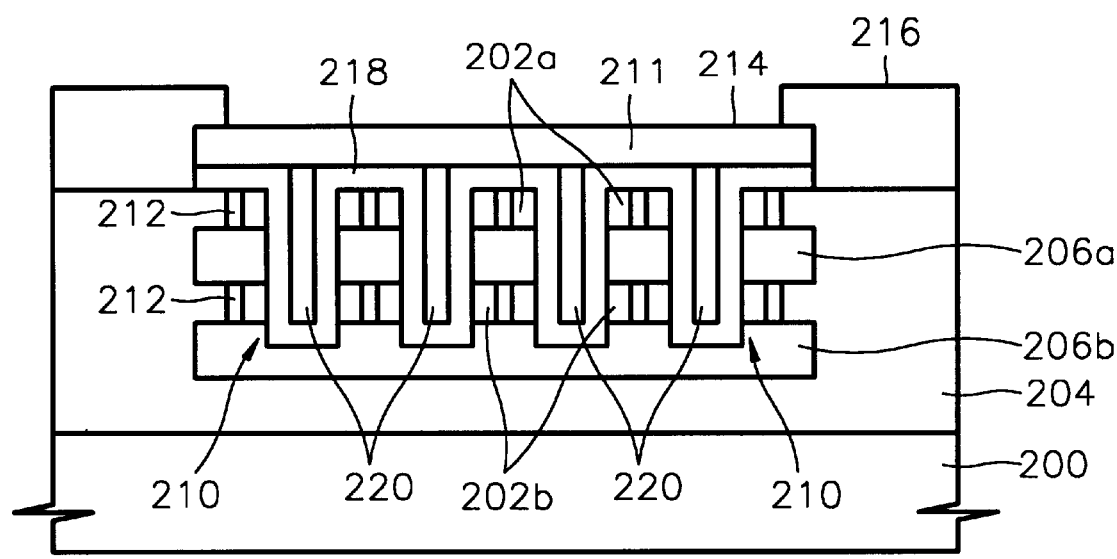

Referring to FIG. 10, conductive regions 220 are then formed in the new cavities 208' defined by the conductive layer 218, preferably from deposition of a conductive material such as tungsten. Prior to formation of the conductive regions 220, the structure may be planarized by CMP. The conductive pad region 211 is then formed, contacting the conductive layer 218 and the conductive regions 220, preferably by deposition of aluminum or copper using sputtering or CVD, followed by patterning. As illustrated in FIG. 11, a passivation layer 216, e.g., a layer comprising a material such as silicon oxynitride or silicon dioxide, is then formed and patterned to expose the conductive pad region 211.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A bonding pad structure, comprising:
   a first conductive layer;
   a first insulation layer on the first conductive layer; and
   a conductive region on the first insulation layer, the conductive region including a conductive pad region and a plurality of conductive fingers extending from the conductive pad region through respective openings in the first insulation layer and the first conductive layer, contacting the first conductive layer along respective sidewall surfaces of the respective openings in the first conductive layer.

2. A bonding pad structure according to claim 1, further comprising a plurality of conductive vias extending between the first conductive layer and the conductive pad region, interspersed amongst the plurality of conductive fingers.

3. A bonding pad structure according to claim 1, further comprising:
   a second insulation layer underlying the first conductive layer; and
   a second conductive layer underlying the second insulation layer,
   wherein respective ones of the plurality of conductive fingers extend through respective openings in the first insulation layer, the first conductive layer and the second insulation layer to contact the second conductive layer.

4. A bonding pad structure according to claim 3, further comprising:
   a first plurality of conductive vias extending between the first conductive layer and the conductive pad region, interspersed amongst the plurality of conductive fingers; and
   a second plurality of conductive vias extending between the first conductive layer and the second conductive layer, interspersed amongst the plurality of conductive fingers.

5. A bonding pad structure according to claim 1, wherein the plurality of conductive fingers substantially conform to flared portions of openings in at least one of the first insulation layer and the first conductive layer.

6. A bonding pad structure according to claim 1:
   wherein respective ones of the openings in the first insulation layer comprise respective concave sidewall surfaces; and
   wherein respective ones of the conductive fingers comprise respective convex sidewall surfaces that substantially conform to the concave sidewall surfaces.

7. A bonding pad structure according to Claim l,wherein respective ones of the conductive fingers comprise respective slanted sidewall surfaces that substantially conform to slanted sidewall surfaces in openings in at least one of the first insulation layer and the first conductive layer.

8. A bonding pad structure according to claim 3, wherein the conductive region comprises:
   a third conductive layer on the first insulation layer, substantially conforming to sidewall surfaces of the openings in the first and second insulation layers, defining a plurality of volumes extending through the first insulation layer, the first conductive layer, and the second insulation layer, and contacting the second conductive layer through the openings in the first and second insulation layers;
   a plurality of conductive regions, respective ones of which fill respective ones of the volumes; and
   a fourth conductive layer on the third conductive layer, contacting the plurality of conductive regions.

9. A device according to claim 8, wherein the opening in the insulation layer has an slanted sidewall surface, and wherein the conductive finger has a complementary slanted sidewall surface mating with the slanted sidewall surface of the opening in the insulation layer.

10. A microelectronic device, comprising:
    a substrate;
    a conductive layer on the substrate;
    an insulation layer on the conductive layer, the insulation layer having a first side, an opposite second side contacting the conductive layer, and an opening passing from the first side to the second side including a flared portion that increases in cross-sectional area in a direction away from the first side; and
    a conductive finger interlocked with the insulation layer, the conductive finger extending from the first side of the insulation layer to the conductive layer and substantially conforming to the flared portion of the opening.

11. A device according to claims 10, wherein the opening in the insulation layer has a concave sidewall surface, and wherein the interlocked conductive finger has a complementary convex sidewall surface contacting the concave sidewall surface of the opening.

12. A device according to claim 10:
    wherein the insulation layer has a plurality of openings therethrough, a respective one of which passes from the first side to the second side, wherein respective flared portions of respective ones of the openings increase in cross-sectional area in a direction away from the first side; and
    wherein the conductive finger comprises respective conductive fingers extending through respective ones of the openings and substantially conforming to the respective flared portions thereof.

13. A device according to claim 10, wherein the conductive layer contacts the conductive finger at a sidewall surface of the conductive finger.

14. A bonding pad for contacting a conductive layer underlying an insulation layer on a microelectronic substrate, the bonding pad comprising:
    a conductive finger extending through an opening in the insulation layer to contact the underlying conductive layer, the conductive finger having a flared portion that increases in cross-sectional area in a direction towards the substrate and that mates with a flared sidewall surface of the opening in the insulation layer.

15. A bonding pad according to claim 14, further comprising a conductive pad portion on the insulation layer, and wherein the conductive finger extends from the conductive pad portion through the insulation layer to conduct the underlying conductive layer.

16. A bonding pad according to claim 14, wherein the conductive finger has a convex sidewall surface that mates with a concave sidewall surface of the opening in the insulation layer.

17. A bonding pad according to claim 14, wherein the conductive finger has a slanted inclined sidewall surface that mates with a slanted sidewall surface of the opening in the insulation layer.

18. A bonding pad according to claim 14, comprising respective conductive fingers extending through respective openings in the insulation layer, a respective one of the conductive fingers including a flared portion that increases in cross-sectional area in a direction towards the substrate and mates with a flared sidewall surface of a respective one of the openings in the insulation layer.

19. A bonding pad according to claim 14, wherein the conductive layer contacts the conductive finger at a sidewall surface of the conductive finger.

20. A method of forming a bonding pad structure, the method comprising the steps of:

forming a first conductive layer on a substrate;

forming a first insulation layer on the first conductive layer; and forming a conductive region on the first insulation layer, the conductive region including a conductive pad region and a plurality of conductive fingers extending from the conductive pad region through respective openings in the first insulation layer and the first conductive layer, contacting the first conductive layer along respective sidewall surfaces of the openings in the first conductive layer.

21. A method according to claim 20, wherein said step of forming a conductive region comprises the steps of:

removing portions of the first insulation layer to form a plurality of cavities and expose portions of the first conductive layer in the cavities; and depositing conductive material on the substrate, filling the cavities and contacting the exposed portions of the first conductive layer.

22. A method according to claim 21:

wherein said step of removing portions comprises the step forming concave sidewall surfaces in openings in the first insulation layer; and wherein said step of depositing conductive material comprises the step of depositing conductive material through the openings in the first insulation layer to form a plurality of conductive fingers having convex surfaces that contact the concave sidewall surfaces.

23. A method according to claim 22, wherein said step of removing portions comprises the steps of:

dry-etching to remove portions of the first insulation layer, form a plurality of openings therein and expose portions of the first conductive layer; and wet-etching to form concave sidewall surfaces in the openings in the first insulation layer.

24. A method according to claim 21:

wherein said step of removing portions comprises the step of forming slanted sidewall surfaces in the cavities; and wherein said step of depositing conductive material comprises the step of depositing conductive material in the cavities to form a plurality of conductive fingers having slanted surfaces that contact the slanted surfaces in the cavities.

25. A method according to claim 21, wherein said step of forming a conductive region comprises the steps of:

depositing a second conductive layer that substantially conforms to the first insulation layer and to sidewall surfaces of the cavities, defining a new plurality of cavities and contacting the exposed portions of first conductive layer;

forming a plurality of conductive regions in the new plurality of cavities; and depositing a third conductive layer on the second conductive layer and the plurality of conductive regions.

26. A method according to claim 25:

wherein said step of depositing a second conductive layer comprises the step of depositing a second conductive layer comprising at least one of aluminum and copper;

wherein said step of forming a plurality of conductive regions comprises the step of forming a plurality of tungsten-containing regions; and wherein said step of depositing a third conductive layer comprises the step of depositing a third conductive layer comprising at least one of aluminum and copper.

27. A method according to claim 20:

wherein said step of forming a first conductive layer is preceded by the steps of:

forming a second conductive layer; and forming a second insulation layer on the second conductive layer;

wherein said step of forming a first conductive layer comprises the step of forming the first conductive layer on the second insulation layer;

wherein said step of forming a conductive region comprises the step of forming a conductive region on the first insulation layer, the conductive region including a conductive pad region and a plurality of conductive fingers, respective ones of which extend from the conductive pad region through respective openings in the first insulation layer, the first conductive layer and the second insulation layer to contact the second conductive layer.

28. A method according to claim 27, wherein said step of forming a conductive region comprises the steps of:

removing portions of the first insulation layer, the first conductive layer, and the second insulation layer to form a plurality of cavities and expose portions of the first and second conductive layers in the cavities;

forming a conductive region on the substrate, filling the cavities and contacting the exposed portions of the first and second conductive layers.

29. A method according to claim 27, wherein said step of forming a conductive region comprises the steps of:

forming a third conductive layer that substantially conforms to the first insulation layer and to sidewall surfaces of the cavities, defining a new plurality of cavities and contacting the exposed portions of the first and second conductive layers; and forming respective conductive regions in respective ones of the new plurality of cavities.

30. A method according to claim 20:

wherein said step of forming a conductive region is preceded by the step of forming a plurality of conductive vias extending through the first insulation layer to contact the first conductive layer; and wherein said step of forming a conductive region comprises the step of forming a conductive region on the first insulation layer and the plurality of conductive vias, the conductive region including a plurality of conductive fingers interspersed among the plurality of conductive vias, respective ones of the conductive fingers extending from the conductive region through respective openings in the first insulation layer and the first conductive layer, contacting the first conductive layer along respective sidewall surfaces of the openings in the first conductive layer.

31. A method according to claim 26:

wherein said step of forming a first conductive layer is preceded by the step of forming a plurality of conductive vias extending through the second insulation layer to contact the second conductive layer;

wherein said step of forming a first conductive layer comprises the step of forming the first conductive layer on the second insulation layer and the plurality of conductive vias;

wherein said step of forming a conductive region is preceded by the step of forming a plurality of conductive vias extending through the first insulation layer to contact the first conductive layer; and wherein said step of forming a conductive region comprises the step of forming a conductive region on the first insulation layer and the plurality of conductive vias, the conductive region including a plurality of conductive fingers interspersed among the plurality of conductive vias, respective ones the conductive fingers extending from the conductive region through respective openings in the first insulation layer and the first conductive layer, contacting the first conductive layer along respective sidewall surfaces of the openings in the first conductive layer.

32. A method of forming a bonding pad for contacting a conductive layer underlying an insulation layer on a microelectronic substrate, the method comprising the steps of:

forming an opening in the insulation layer, the opening including a flared portion that increases in cross-sectional area towards the substrate;

forming a conductive region interlocked with the insulation layer, the conductive region including a conductive finger extending through the opening in the insulation layer to contact the underlying conductive layer, the conductive finger having a flared portion that increases in cross-sectional area towards the substrate and mates with the flared portion of the opening in the insulation layer.

33. A method according to claim 32:

wherein said step of forming an opening comprises the step of forming an opening in the insulation layer that has concave sidewall surface; and wherein said step of forming a conductive region comprises the step of forming a conductive finger that has a convex surface that contacts the concave surface of the opening.

34. A method according to claim 32:

wherein said step of forming an opening comprises the step of forming an opening in the insulation layer that has a slanted sidewall surface; and wherein said step of forming a conductive region comprises the step of forming a conductive finger having a slanted sidewall surface that contacts the slanted sidewall surface of the opening.

35. A method according to claim 32:

wherein said step of forming an opening comprises the step of forming a plurality of openings in the insulation layer, respective ones of the openings including respective flared portions that increase in cross-sectional area towards the substrate; and wherein said step of forming a conductive region comprises the step of forming respective conductive fingers extending through respective openings in the insulation layer, respective ones of the conductive fingers including respective flared portions that increase in cross-sectional area towards the substrate and mate with respective ones of the flared portions of the openings in the insulation layer.

\* \* \* \* \*